United States Patent
Hua et al.

(10) Patent No.: US 10,885,074 B2
(45) Date of Patent: Jan. 5, 2021

(54) MEMORY OPTIMIZATION SYSTEM FOR INVERTED INDEXES

(71) Applicant: SAP SE, Walldorf (DE)

(72) Inventors: Calvin Hua, Waterloo (CA); Reza Sherkat, Waterloo (CA); Colin Florendo, Marlborough, MA (US); Mihnea Andrei, Issy les Moulineaux (FR)

(73) Assignee: SAP SE, Walldorf (DE)

( * ) Notice: Subject to any disclaimer, the term of this patent is extended or adjusted under 35 U.S.C. 154(b) by 218 days.

(21) Appl. No.: 16/059,665

(22) Filed: Aug. 9, 2018

(65) Prior Publication Data

US 2020/0050699 A1 Feb. 13, 2020

(51) Int. Cl.
*G06F 16/31* (2019.01)
*H03M 7/40* (2006.01)
*G06F 16/901* (2019.01)
*G06F 16/9038* (2019.01)

(52) U.S. Cl.
CPC ........ *G06F 16/319* (2019.01); *G06F 16/9017* (2019.01); *G06F 16/9038* (2019.01); *H03M 7/4075* (2013.01)

(58) Field of Classification Search
CPC . G06F 16/319; G06F 16/9038; G06F 16/9017
See application file for complete search history.

(56) References Cited

U.S. PATENT DOCUMENTS

| | | | |
|---|---|---|---|
| 7,986,696 B1* | 7/2011 | Miliavisky | H04L 45/54 370/392 |
| 2011/0125771 A1* | 5/2011 | Gladwin | G06F 3/067 707/758 |
| 2017/0337003 A1* | 11/2017 | Rutherglen | G06F 16/319 |

OTHER PUBLICATIONS

Büttcher, S. et al., "Index Compression," *Information Retrieval: Implementing and Evaluating Search Engines*, Cambridge, MIT Press, ISBN 978-0-262-02651-2, pp. 174-227, Copyright 2010.
Golomb, S.W. et al., "Run-Length Encodings," *IEEE Transactions on Information Theory*, vol. 12, No. 3, pp. 399-401, Jul. 1, 1966.
Manning, C. et al., "Boolean retrieval," *Introduction to Information Retrieval*, Cambridge England, Cambridge University Press, pp. 1-17, 2009.

(Continued)

*Primary Examiner* — Loc Tran
(74) *Attorney, Agent, or Firm* — Sterne, Kessler, Goldstein & Fox P.L.L.C.

(57) ABSTRACT

Disclosed herein are system, method, and computer program product embodiments for providing a memory optimization system for inverted indexes. An embodiment operates by determining a value identifier corresponding to a value to be searched for in a database based on a query. From a lookup table, a prefix of an offset corresponding to a location in a compressed posting list that identifies row locations where the value is found in the database is retrieved. From a directory page, a suffix of the offset corresponding to the location is retrieved. The offset is generated based on the prefix and the suffix. From the posting list, row identifiers corresponding to the generated offset are retrieved. The retrieved row identifiers are returned responsive to the query.

12 Claims, 6 Drawing Sheets

(56) References Cited

OTHER PUBLICATIONS

*SAP HANA One Administration Guide*, pp. 207-218, Chapter 2.5.5, "The Delta Merge Operation," [Online]. SAP SE, Sep. 3, 2016 [retrieved on Feb. 4, 2019], Retrieved from https://help.sap.com/viewer/6b94445c94ae495c83a19646e7c3fd56/2.0.01/en-US/bd9ac728bb57101482b2ebfe243dcd7a.html.

Sherkat, R. et al., "Page as You Go: Piecewise Columnar Access in SAP HANA," *Proceedings of the 2016 International Conference on Management of Data*, pp. 1295-1306, Jul. 1, 2016.

Wang, J. et al., "MILC: Inverted List Compression in Memory," *Proceedings of the VLDB Endowment*, pp. 853-864, Apr. 2017.

\* cited by examiner

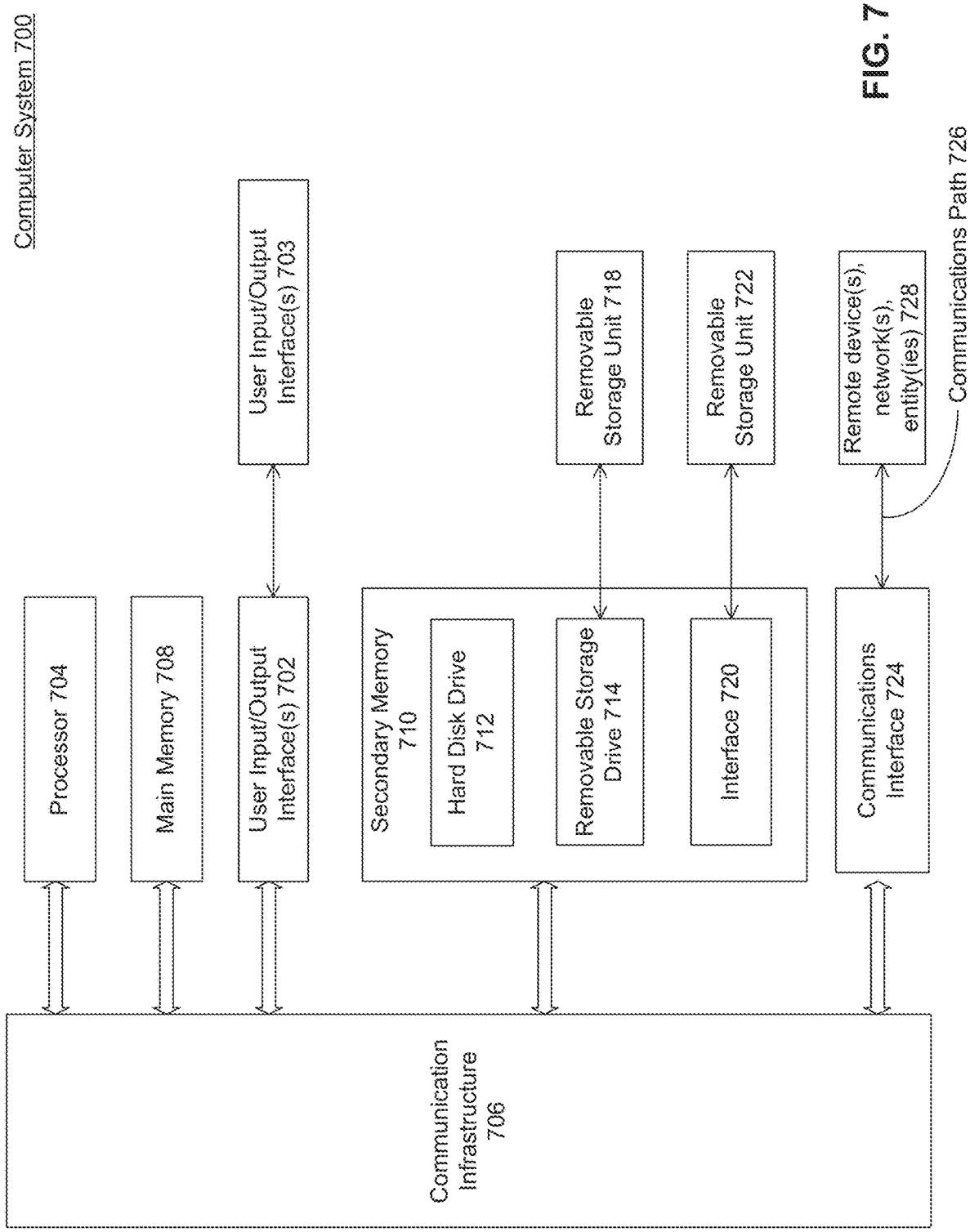

MEMORY OPTIMIZATION SYSTEM FOR INVERTED INDEXES

BACKGROUND

An index is a data structure that improves the performance of searches on data. In an embodiment, an index may include a mapping of data (e.g., a dictionary). Then, for example, when a query is performed on the data, the index may be referenced rather than searching the underlying data. Using an index may save processing resources for data systems with large amounts of data. However, to be most useful, indexes are often stored in primary memory (such as random access memory). This can pose a problem, because as the data grows so too grows the size of the index, consuming valuable primary memory.

BRIEF DESCRIPTION OF THE DRAWINGS

The accompanying drawings are incorporated herein and form a part of the specification.

FIG. 7 is an example computer system useful for implementing various embodiments.

In the drawings, like reference numbers generally indicate identical or similar elements. Additionally, generally, the left-most digit(s) of a reference number identifies the drawing in which the reference number first appears.

DETAILED DESCRIPTION

Provided herein are system, apparatus, device, method and/or computer program product embodiments, and/or combinations and sub-combinations thereof, for providing a memory optimization system for inverted indexes.

Figure 1:
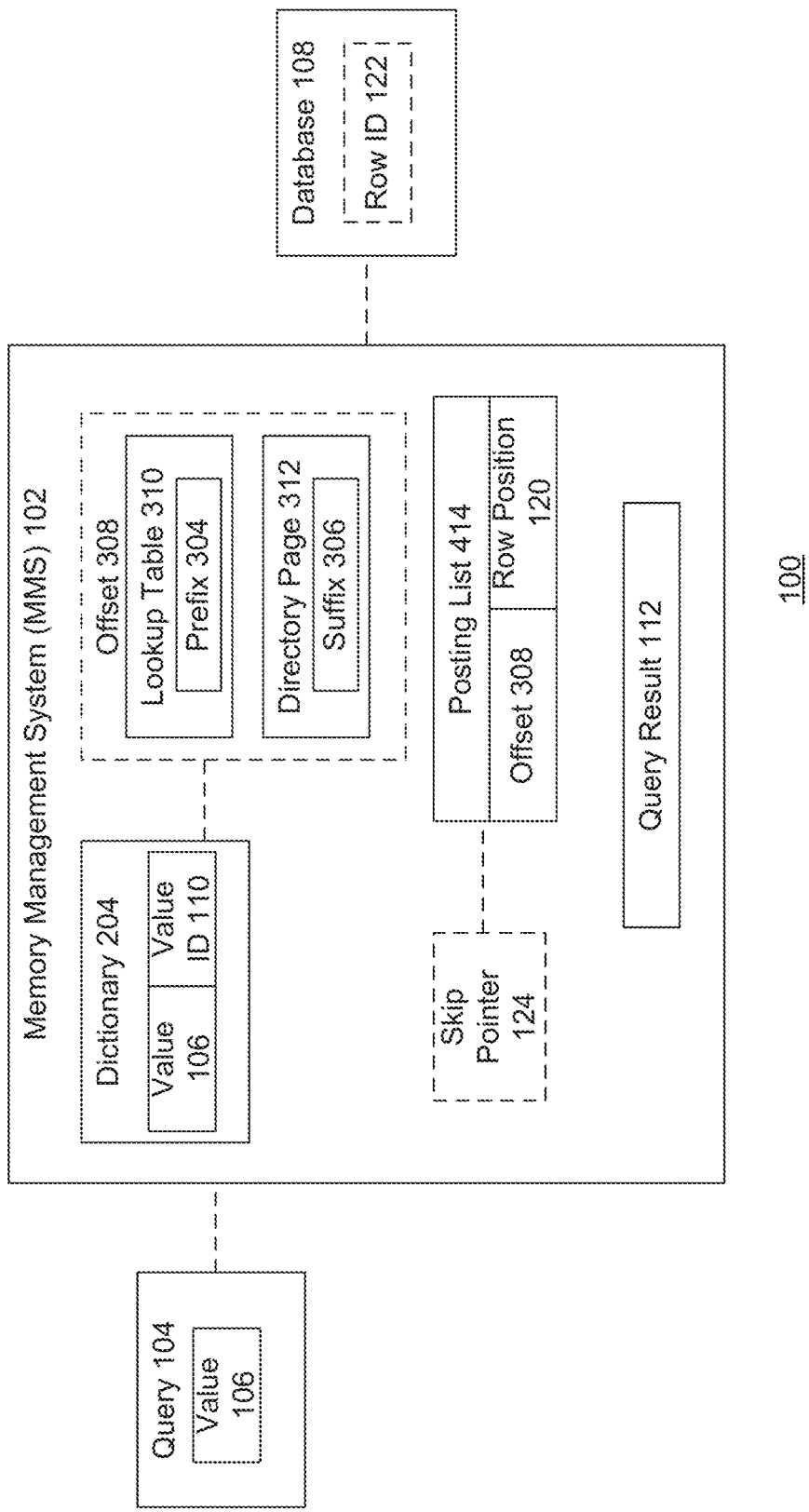
FIG. 1 is a block diagram illustrating example functionality for providing memory optimization for inverted indexes, according to some embodiments.

FIG. 1 is a block diagram 100 illustrating an example system and functionality for providing memory optimization for inverted indexes, according to some embodiments. Memory management system (MMS) 102 executes query lookups 104 and value 106 searches using memory optimization techniques described herein.

An inverted index may be a data structure which may be used to improve the performance of queries 104. The inverted index may track where particular data or values 106 are found within a database 108 or set of documents. For example, given a particular search term or key value 106, rather than performing a complete scan on the underlying data of database 108, such as the data of a particular column of database 108, MMS 102 may use an inverted index to identify the row identifiers 122 of database 108 that include the value 106.

To be most useful an inverted index is often stored in primary memory (such as random access memory or RAM; primary memory may also be referred to herein as main memory or simply memory) of a computing device (in contrast to secondary storage such as a hard drive or disk storage), using the inverted index also saves valuable computing cycles, processing power, and time that would otherwise be necessary to perform a database search on the data of database 108, which may include a disk search. For in-memory databases, when a column is loaded into memory, a database search may include searching the data that has been stored or loaded into memory. But these advantages are achieved only at the cost of using valuable space in memory to store the index. As such, it would be beneficial to reduce the amount of memory space consumed by an inverted index.

Figure 2A:
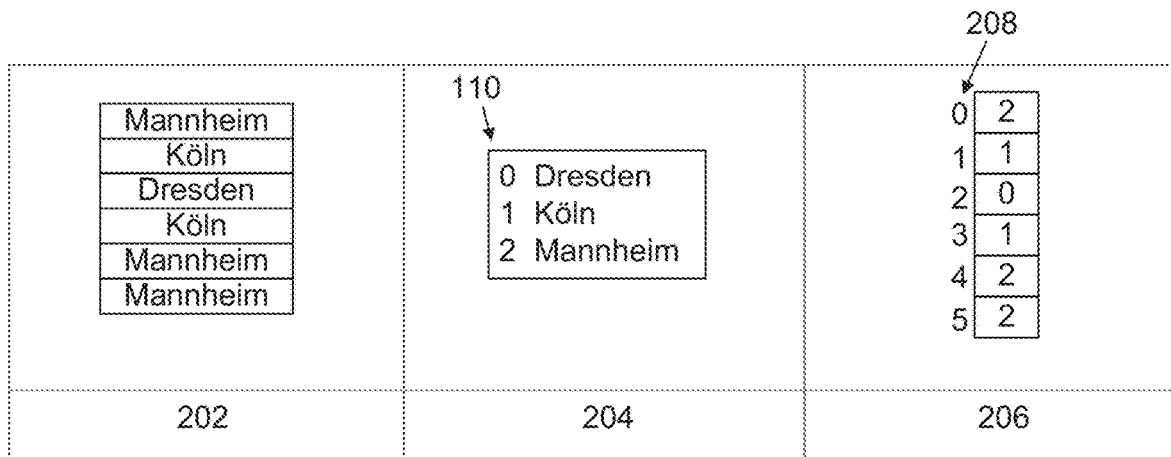
FIGS. 2A and 2B illustrate example data structures related to constructing an inverted index, according to some embodiments.
Figure 2B:
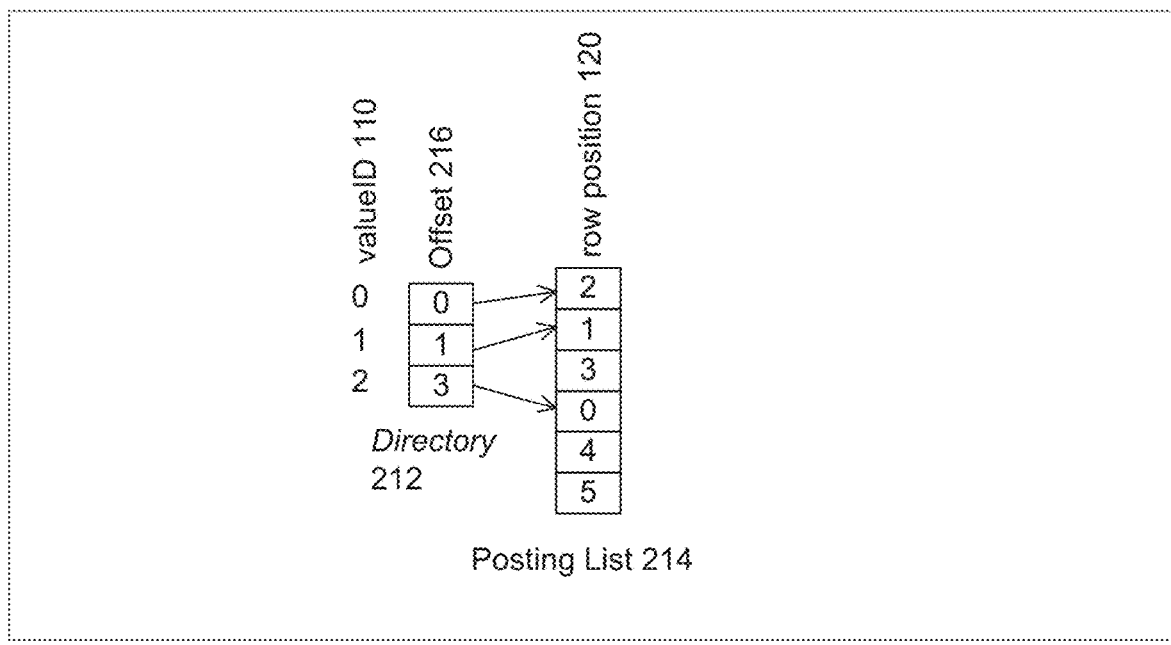

FIGS. 2A and 2B illustrate example data structures related to constructing an inverted index, according to some embodiments. FIG. 2A illustrates an example set of data 202, an example data dictionary 204, and an example value II) vector 206 (vector 206). In an embodiment, data 202 may be an example of data that may be stored in a particular column of database 108.

Data dictionary 204 may map value IDs 110 to values 106 (and vice versa) extracted from the underlying data of database 108. In an embodiment, data dictionary 204 may be used to use less storage space (on disk and/or in memory) with regard to storing the underlying data of database 108. For example, each unique value from data 202 may be assigned its own value identifier 110 (value II) 110). As illustrated in FIG. 2A, the three unique values each have their own integer value ID. For example, the value ID of Dresden is 0. In an embodiment, value ID 110 may be a non-negative integer key.

Vector 206 illustrates how the data 202 may be re-mapped using value IDs 110 of data dictionary 204. The values 208 may indicate a corresponding row location or row ID 122 (in database 108) corresponding to the value IDs of vector 206. As may be seen, vector 206 has a smaller memory footprint or consumes less memory space than data 202. For example, it requires less storage capacity to store the integer value ID "2" multiple times than it does to store "Mannheim" multiple times.

Generally, to execute a query 104 for the value 106 "Mannheim" from vector 206, first the value ID 110 for "Mannheim" is looked up from dictionary 204. The lookup reveals that value ID="2". A search for value ID 2 in vector 206 produces a query result of row IDs 0, 4, 5.

FIG. 2B illustrates an example inverted index 210, according to an embodiment. To improve the performance of the query search for "Mannheim," an inverted index 210 may be constructed from vector 206. In an embodiment, inverted index 110 may include multiple data structures, such as a directory data structure 212 and a posting list data structure 214.

For each value ID 110, directory 212 may include an offset 216 that points or refers to an entry in posting list 214. In an embodiment, posting list 214 may be a vector or sequence of row positions, where the row positions of the same value ID 110 are stored next to each other. For example, value ID=2 appears in row positions 0, 4, and 5 (as illustrated in vector 206). As illustrated in the example posting list 214, row positions 0, 4, and 5 are next to each other and correspond to offset value 3. In an embodiment, postings list 214 may be traversed by an iterator (of MMS 102) to retrieve the relevant row positions or IDs that correspond the offset 216 to the value ID that was searched.

To find the rows that contain value ID=2, MMS 102 may find the offset 216 of value ID=2 from directory 212. As may be seen, the offset 216 of value ID=2, is 3. This may indicate that the first row position corresponding to value ID may be found at the fourth position in posting list 214, or that 3 values or row positions in posting list 214 precede the rows of value ID 2. As such, an iterator may move or jump to the fourth position of posting list 214 to retrieve the row positions 120 (if posting list 214 is uncompressed). In an embodiment, row position 120 may include a pointer to a memory location of the row or record in database 108. In another embodiment, row position 120 may include a row ID 122 in database 108.

Inverted indexes may be used by both disk-based databases as well as in-memory databases. For an in-memory databases, such as database 108, an index (e.g., 210) may be stored in memory. Storing the index in memory (rather than in disk storage) may provide for better performance as it reduces the number of disk inputs/outputs, as accessing a disk is slower and consumes more processing cycles than accessing memory.

However, the size of an index may be proportional to the size of an in-memory column. So as the size of the data 202 of database 108 increases, so too does the size of index 210 and the amount of memory that the index 210 consumes both increase. As more the index 210 is stored in memory, the less memory is available for other data or processes.

As such, in some embodiments, MMS 102 configures an index 210 to reduce or minimize the memory footprint being consumed by an index 210 without hindering the performance or retrieval time and usefulness of the index. In an embodiment, reducing the memory footprint consumed by an index 210 frees up the memory so that it may be used by other objects or applications. For example, more free memory may reduce how often data (of database 108) is removed and added back to memory from disk, thus reducing the number of disk I/O operations.

In an embodiment, as described herein, MMS 102 may divide a general index 210 into smaller portions which may be compressed and loaded into memory as needed, rather than maintaining an entire general index 210 in memory.

As described above with respect to FIGS. 2A and 2B, before the row positions 120 of a particular value 106 can be identified from a posting list 414, the value ID 110 may first be identified. This may be referred to as the find value functionality. In an embodiment, MMS 102 may modify a find value API (application programming interface) for performing query searches operates.

In an uncompressed inverted index (e.g., 210), the row positions may use the same number of bits, 32 bits. An entry in directory 212 may indicate a value ID 110 and a corresponding offset 216 to a position in posting list 214. Each memory page may be a constant size, and each posting list 214 may include the number of encoded row positions. In an embodiment, the number of encoded row positions may be fixed for memory pages.

However, compressing an inverted index (or portions thereof, the directory 212 and/or the posting list 214) may consume less memory than an uncompressed index. One example of a compression technique that may be used to compress an inverted index, or portions thereof, is Golomb compression or encoding, which is an example of a lossless compression that may be used by MMS 102.

Using Golomb compression the posting list section of on an inverted index may produce variable length results. As such, a directory offset dedicated to storing row positions (using Golomb compression) may not contain a fixed number or length of row positions as in an uncompressed inverted index. Also, an in-memory Golomb (compressed) inverted index may be referenced using byte offsets (e.g. 216), which are recorded using 64 bits (as opposed to 32 bits for uncompressed inverted indexes).

In a Golomb compressed inverted index, there may be a limit of having $2^{32}$ possible row positions per column partition. Accordingly, uncompressed $2^{(32+2)}$ bits are sufficient to account for the different row positions offsets or variations. As such, byte offsets of a corresponding postings list (e.g., 214) would fall within the range (0 . . . 1 . . . 2 . . . $2^{34}$-1). Thus, at most 34 bits would be necessary to account for all possible byte offset values. As such, using 64 bits when only 34 are required wastes valuable memory space (particularly, when the index is loaded into memory). MMS 102 may save these unused memory bits by dividing the byte offset into various portions (a prefix and a suffix) which are then combined to identify the byte offsets in a posting list.

Figure 3:
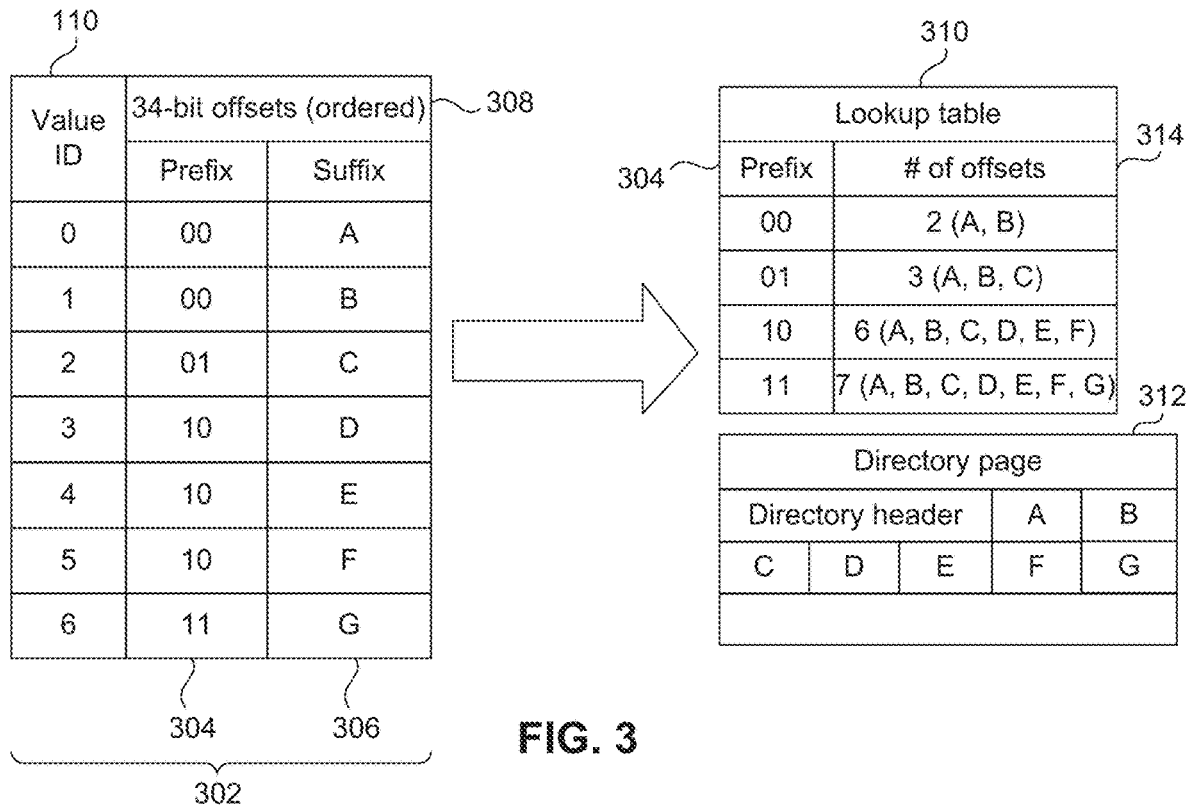
FIG. 3 illustrates an example memory optimized directory structure, according to some embodiments.

FIG. 3 illustrates an example memory optimized directory structure, according to an example embodiment. Directory 302 may include an example of a directory structure (as described above with respect to directory 212) using byte offsets (with Golomb compression). As shown in directory 302, a first column may include a value ID 110, which may correspond to unique underlying data values in a data dictionary (e.g., 204).

Each value ID 110 may include its own 34-bit byte offset 308 that corresponds to a compressed posting list (not shown). As noted above, other systems may use 64 bits (e.g., 2 bytes) to store the 34 bit offset values, which may waste valuable memory resources. MMS 102, by contrast, may divide the 34-bit byte offset 308 into two portions, a prefix 304 and a suffix 306. This division enables MMS 102 to use less than 64 bits to store the byte offset value, thus saving valuable memory space.

In an embodiment, the 34 bit offset 308 may be divided into a 2-bit prefix 304 and a 32 bit suffix 306. With a two bit prefix 304, there are only four possible prefix combinations which are illustrated in lookup table 310. The four possible prefix combinations are 00, 01, 10, and 11, which are included in lookup table 310 in ascending order. In another embodiment, the prefixes may be arranged in descending order.

Each value ID 110, however, may have its own unique suffix 306 within a particular prefix. In an embodiment, two value IDs with different prefixes may have identical suffixes 306. In the example of FIG. 3, the suffix may include the remaining 32 bits. For simplicity sake, the 32 bit suffix string of bits is represented by a corresponding letter A, B, C, . . . G. A directory or memory page 312 may include the various suffixes 306 that correspond to the suffixes of directory 302.

In an embodiment, rather than storing everything in a general directory structure 302 which may require 64 bits to store offset 308, MMS 102 may use a combination of lookup table 310 and directory page 312. Together, these elements use less memory space than general directory 302 as described above, for the complete inverted index.

From general directory 302, it may be seen that for value ID 4, the offset 308 is 10+E (i.e., the 32 bits that correspond to F). In an embodiment, MMS 102 may construct the same offset 308 from lookup table 310 and directory page 312 as described below.

In an embodiment, lookup table 310 may include the prefix 304 and the number of offsets value 314. However, the actual stored lookup table 310 may not include the corresponding list of suffixes as shown in the parenthesis. The values (A, B, C . . . ) are illustrated in lookup table 310 for solely for purposes of illustration. In some embodiments, only the numeral 314 may be stored. For example, the first entry may be (00, 2).

The numeral 314 may indicate how many value IDs 110 include that prefix value, or a preceding prefix value. For example, as may be seen from directory 302, there are two value IDs (0, 1) that include the prefix 00. As such, the corresponding numeral 314 indicates 2 (indicating that the first two value IDs have the prefix 00). As may be seen from directory 302, only 1 value ID 110 (2) includes the prefix 01. As such, the corresponding number 314 is 3 (indicating a combination of the value IDs from prefix 00 and the number of value IDs that include the prefix 01).

Thus, to look up value ID 4 in lookup table 310, since 4 is the fifth value, that falls that corresponds to prefix 10 (it falls within the range between 4-6 of prefix 10, inclusive). Similarly, the fifth value in directory page 312 corresponds to E. As such, it may be determined that the offset 308 corresponding to value ID 4 is $2^{32}$+E, which means the binary value "10" (i.e. the prefix) shifted by 32 positions. That byte offset 308 may then be used to identify the start of the corresponding posting list for value ID 4 (e.g., 214). We can then iterate over all row positions included in the posting list.

Figure 4:
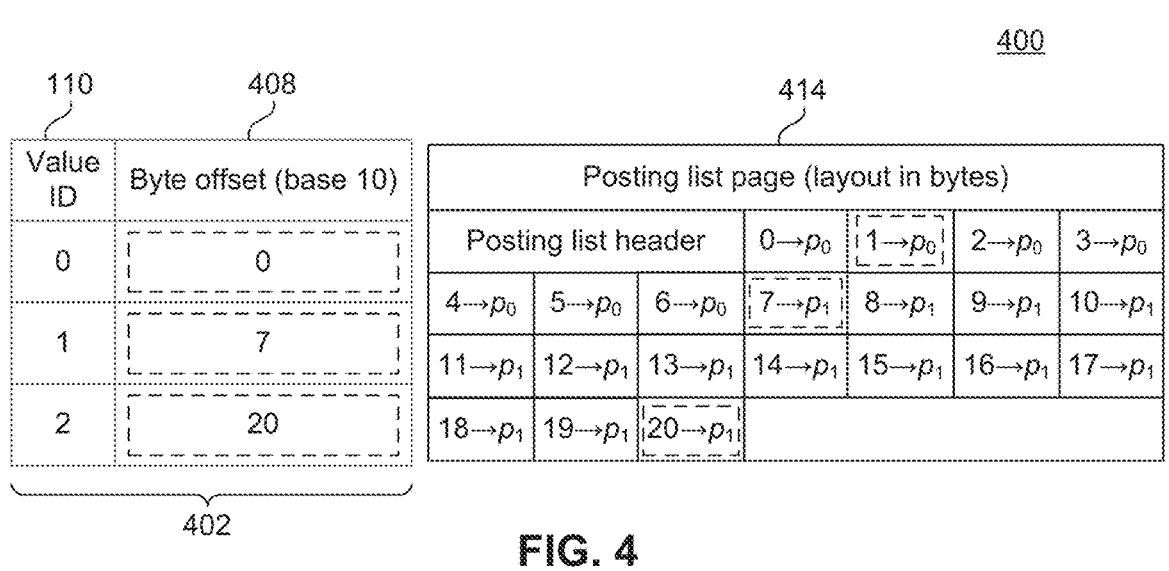
FIG. 4 illustrates an example compressed inverted index, according to some embodiments.

FIG. 4 illustrates a compressed inverted index 400, according to an embodiment. A directory 402 may include a value ID 110 and corresponding byte offset values 408. In an embodiment, the byte offset values 408 may be determined using a lookup table 310 and directory page 312 described above with respect to FIG. 3.

As shown in posting list 414, the values from 0 through 6 may correspond to row positions that include value 0. This may be followed by the row positions for a particular column of database 108 that include value 1.

In an embodiment, to save more memory, MMS 102 may cluster or group of posting lists. For example, a cluster size of 2 may cause MMS 102 to group posting lists into pairs (P0, P1), (P2, P3), etc. Clustering the posting list entries in pairs may reduce the number of directory entries by a factor of 2, effectively cutting its size in half. The pointer or offset 408 may then point to the beginning of the cluster.

In an embodiment, to further reduce memory overhead, inverted indexes can be paged. Paging may be a memory management scheme in which a computing device stores and retrieves data from secondary storage (such as disk) for use in main memory. With paging, an operating system may retrieve data from secondary storage in same sized blocks called pages.

A paged inverted index may be divided into different pages, and may include index lookup algorithms that are adapted or configured to access only a subset of pages on demand. The inverted index may include a linked list of pages. Paging may enable portions of an inverted index (i.e., from directory or posting list) to be retrieved and stored in memory, rather than storing the entire index in memory (which would consume more processing resources to retrieve and more memory space to store).

Figure 5:
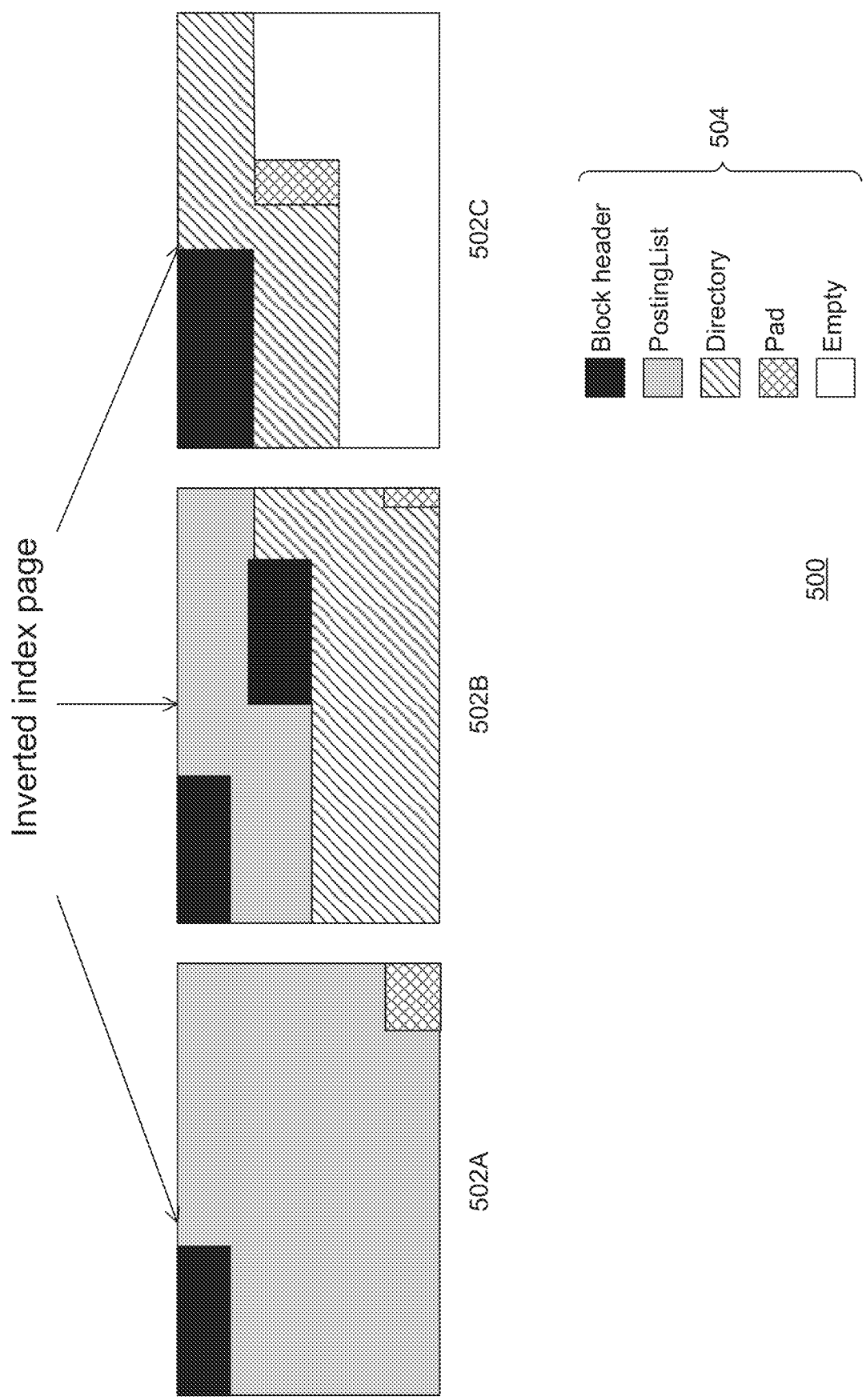
FIG. 5 illustrates an example of the physical layout of a paged inverted index, according to some embodiments.

FIG. 5 illustrates an example of the physical layout of a paged inverted index 500, according to an embodiment. The example paged inverted index 500 includes three pages, 502A-C. Each page block 502 may include different types of data as indicated by the key 504, though each page may include its own header information. Block 502A may include a posting list information but no directory information. Block 502B may include posting list and directory information. Block 502C may include directory information but no posting list information. In an embodiment, padding may be added to the end of a posting list to ensure the posting list remains byte aligned.

An advantage of using paging is that when directory is being accessed, the page 502A could be removed from memory (if already loaded), or could be avoided from being loaded in the first place. Thus, rather than storing a particular index in memory, particular portions or relevant pages 502 may be retrieved and loaded at any given time depending on what functionality is being executed.

As referenced above, MMS 102 may execute an iterator that traverses a posting list (e.g., 216) to identify and return the various row positions or identifiers within a particular posting list (corresponding to a particular column) that include a specified value/value ID.

Uncompressed inverted indexes may use fixed-length row positions to implement iteration via random-access which may be iterated. However, to save additional memory space, MMS 102 may compress the postings list using an encoding scheme such as Golomb encoding. As such, the iterator for a Golomb indexes cannot iterate (retrieve row positions) in the same manner as an iterator for an uncompressed inverted index. In an embodiment, a Golomb iterator may be a strictly forward iterator that requires a decoder to decompress the data as it iterates.

An in-memory Golomb index may include an entire posting list section in-memory as a contiguous buffer as a second property. This may enable the iterator or index to retrieve words and decode row positions using basic pointer operations (namely, incrementing and dereferencing). However, a paged Golomb index may have a posting list section that is segmented and not entirely loaded. This may be done by design to save memory and avoid having to load everything. Loading all of the pages would waste memory and defeat the purpose of the paging. As such, the iterator and decoder of MMS 102 when iterating on a paged Golomb index may be configured to decode the page that is being loaded, without decoding other pages which were not loaded.

Because Golomb encoding is variable-length, a Golomb decoder of an in-memory Golomb index may decode a row position by accessing multiple words sequentially from its contiguous memory buffer. For a paged Golomb index, directly accessing words is costly because the data is decoded sequentially. Every word can trigger a page load, which may consume additional memory. In an embodiment, the decoder may cache a portion of the page, and this way decoder can access some of the words from the iterator's cache (rather than a page) which reduces the number of direct page calls which then must be decoded.

With paged Golomb indexing, accessing a page may require loading it from secondary memory (from disk) into memory. This may consume more resources and time with excess disk I/O (input/output) operations, because as noted above with respect to FIG. 4, not every page may include data that is to be used. In an embodiment, a posting list 414 may include a long list or multiple row positions corresponding to a particular value ID which may be compressed using Golomb compression.

In an embodiment, MMS 102 may provide a buffer iterator that is designed to return words or values to a paged compressed posting list that was compressed using Golomb encoding. In an embodiment, the iterator's buffer may reserve cache space (less than page space) and may iterate over the cache. The cache would be updated by the iterator on demand. The iterator may use a Golomb decoder to read the Golomb compressed page from the buffer.

In an embodiment, when performing a search, MMS 102 needs to identify the right cluster (corresponding to an offset 308) in a posting list 414. However, if posting list 414 has itself been compressed using Golomb encoding, then because of the compression, the iterator is unable to jump to the offset 308 without decompressing the compressed posting list(s) that may come before the offset position. This decompression is expensive in terms of resource consumption, consuming extra processing cycles, memory space, and other resources.

Instead of decompressing from the very first page of a Golomb compressed posting list 414, MMS 102 may set and use one or more skip pointers 124. Skip pointer 124 may be a preconfigured bookmark that indicates the beginning of the posting list of a particular value ID 110 within the compressed posting list 414 section.

In various embodiments, the number of skip pointers 124 and value IDs 110 between them may vary. For example, an administrator may balance the cost of creating a skip pointer with the cost of decompressing (from a previous skip pointer 124). In an embodiment, if certain value 106/value IDs 110 are known to be accessed more frequently, then MMS 102 may include skip pointers 124 specifically for those values 106. Using a skip pointer 124 may advance the Golomb decoder to that spot within the compressed posting list 414 without consuming the resources to decode everything that came before it.

Figure 6:
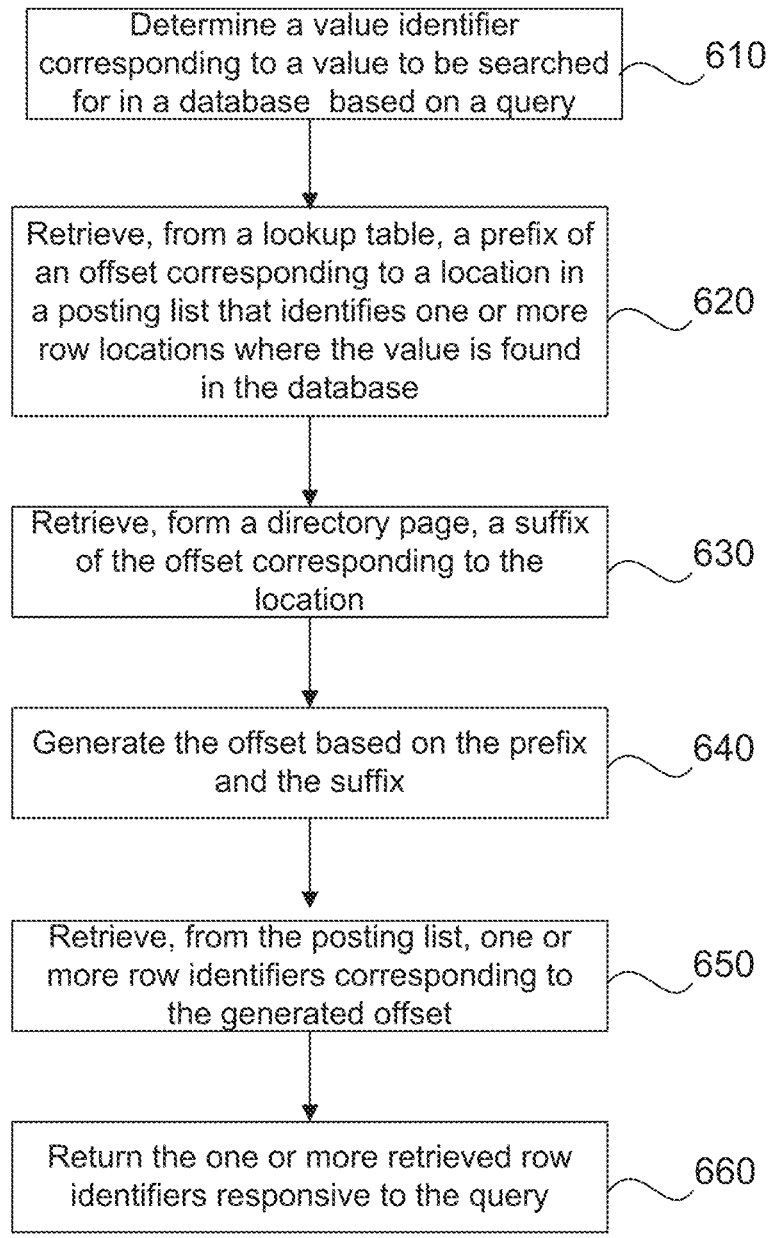
FIG. 6 is a flowchart illustrating example operations for providing memory improvement and optimization for inverted indexes, according to some embodiments.

FIG. 6 is a flowchart 600 illustrating example operations for providing memory improvement and optimization for inverted indexes, according to some embodiments. Method 600 can be performed by processing logic that can comprise hardware (e.g., circuitry, dedicated logic, programmable logic, microcode, etc.), software (e.g., instructions executing on a processing device), or a combination thereof. It is to be appreciated that not all steps may be needed to perform the disclosure provided herein. Further, some of the steps may be performed simultaneously, or in a different order than shown in FIG. 6, as will be understood by a person of ordinary skill in the art. Method 600 shall be described with reference to FIGS. 1-5. However, method 600 is not limited to the example embodiments.

In 610, a value identifier corresponding to a value to be searched for in a database based on a query is determined. For example, MMS 102 may receive a query 104 that includes a value 106. Based on dictionary 204, MMS 102 may identify a value ID 110 corresponding to value 106. This is also illustrated in FIG. 2A, in which an example dictionary is illustrated.

In 620, a prefix of an offset corresponding to a location in a posting list that identifies one or more row positions where the value is found in the database is retrieved from a lookup table. For example, in FIG. 3, the prefix 304 for a value ID 110 may be identified from a lookup table 310.

In 630, a suffix of the offset corresponding to the location is retrieved from a directory page. For example, in FIG. 3, the suffix of the offset 308 may be identified from a directory page 312.

In 640, the offset is generated based on the prefix and the suffix. For example, in FIG. 3, the combination of the prefix 304 and the suffix (which may include 32 bits which are represented by the letters) may be the offset value 308.

In 650, one or more row positions corresponding to the generated offset are retrieved from the posting list. For example, in FIG. 4, the offset 408 may correspond to an entry in posting list 414. In an embodiment, a row position may include a row identifier, offset, or a memory location.

In 660, the one or more retrieved row identifiers are returned responsive to the query. For example, an iterator of MMS 102 may retrieve the row positions from the posting list 414 of FIG. 4. In an embodiment, as shown in FIG. 1, the iterator may identify and return corresponding Row IDs 122 for the row positions retrieved from the posting list 414. The row IDs 112 may be compared against the query 104 and be returned as query result 112.

Various embodiments may be implemented, for example, using one or more well-known computer systems, such as computer system 700 shown in FIG. 7. One or more computer systems 700 may be used, for example, to implement any of the embodiments discussed herein, as well as combinations and sub-combinations thereof.

Computer system 700 may include one or more processors (also called central processing units, or CPUs), such as a processor 704. Processor 704 may be connected to a communication infrastructure or bus 706.

Computer system 700 may also include customer input/output device(s) 703, such as monitors, keyboards, pointing devices, etc., which may communicate with communication infrastructure 706 through customer input/output interface(s) 702.

One or more of processors 704 may be a graphics processing unit (GPU). In an embodiment, a GPU may be a processor that is a specialized electronic circuit designed to process mathematically intensive applications. The GPU may have a parallel structure that is efficient for parallel processing of large blocks of data, such as mathematically intensive data common to computer graphics applications, images, videos, etc.

Computer system 700 may also include a main or primary memory 708, such as random access memory (RAM). Main memory 708 may include one or more levels of cache. Main memory 708 may have stored therein control logic (i.e., computer software) and/or data.

Computer system 700 may also include one or more secondary storage devices or memory 710. Secondary memory 710 may include, for example, a hard disk drive 712 and/or a removable storage device or drive 714. Removable storage drive 714 may be a floppy disk drive, a magnetic tape drive, a compact disk drive, an optical storage device, tape backup device, and/or any other storage device/drive.

Removable storage drive 714 may interact with a removable storage unit 718. Removable storage unit 718 may include a computer usable or readable storage device having stored thereon computer software (control logic) and/or data. Removable storage unit 718 may be a floppy disk, magnetic tape, compact disk, DVD, optical storage disk, and/any other computer data storage device. Removable storage drive 714 may read from and/or write to removable storage unit 718.

Secondary memory 710 may include other means, devices, components, instrumentalities or other approaches for allowing computer programs and/or other instructions and/or data to be accessed by computer system 700. Such means, devices, components, instrumentalities or other approaches may include, for example, a removable storage unit 722 and an interface 720. Examples of the removable storage unit 722 and the interface 720 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 700 may further include a communication or network interface 724. Communication interface 724 may enable computer system 700 to communicate and interact with any combination of external devices, external networks, external entities, etc. (individually and collectively referenced by reference number 728). For example, communication interface 724 may allow computer system 700 to communicate with external or remote devices 728 over communications path 726, which may be wired and/or wireless (or a combination thereof), and which may include any combination of LANs, WANs, the Internet, etc. Control logic and/or data may be transmitted to and from computer system 700 via communication path 726.

Computer system 700 may also be any of a personal digital assistant (PDA), desktop workstation, laptop or notebook computer, netbook, tablet, smart phone, smart watch or other wearable, appliance; part of the Internet-of-Things, and/or embedded system, to name a few non-limiting examples, or any combination thereof.

Computer system 700 may be a client or server, accessing or hosting any applications and/or data through any delivery paradigm, including but not limited to remote or distributed cloud computing solutions; local or on-premises software ("on-premise" cloud-based solutions); "as a service" models (e.g., content as a service (CaaS), digital content as a service (DCaaS), software as a service (SaaS), managed software as a service (MSaaS), platform as a service (PaaS), desktop as a service (DaaS), framework as a service (FaaS), backend as a service (BaaS), mobile backend as a service (MBaaS), infrastructure as a service (IaaS), etc.); and/or a hybrid model including any combination of the foregoing examples or other services or delivery paradigms.

Any applicable data structures, file formats, and schemas in computer system 700 may be derived from standards including but not limited to JavaScript Object Notation (JSON), Extensible Markup Language (XML), Yet Another Markup Language (YAML), Extensible Hypertext Markup Language (XHTML), Wireless Markup Language (WML), MessagePack, XML User Interface Language (XUL), or any other functionally similar representations alone or in combination. Alternatively, proprietary data structures, formats or schemas may be used, either exclusively or in combination with known or open standards.

In some embodiments, a tangible, non-transitory apparatus or article of manufacture comprising a tangible, non-transitory computer useable or readable medium having control logic (software) stored thereon may also be referred to herein as a computer program product or program storage device. This includes, but is not limited to, computer system 700, main memory 708, secondary memory 710, and removable storage units 718 and 722, as well as tangible articles of manufacture embodying any combination of the foregoing. Such control logic, when executed by one or more data processing devices (such as computer system 700), may cause such data processing devices to operate as described herein.

Based on the teachings contained in this disclosure, it will be apparent to persons skilled in the relevant art(s) how to make and use embodiments of this disclosure using data processing devices, computer systems and/or computer architectures other than that shown in FIG. 7. In particular, embodiments can operate with software, hardware, and/or operating system implementations other than those described herein.

It is to be appreciated that the Detailed Description section, and not any other section, is intended to be used to interpret the claims. Other sections can set forth one or more but not all exemplary embodiments as contemplated by the inventor(s), and thus, are not intended to limit this disclosure or the appended claims in any way.

While this disclosure describes exemplary embodiments for exemplary fields and applications, it should be understood that the disclosure is not limited thereto. Other embodiments and modifications thereto are possible, and are within the scope and spirit of this disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments can perform functional blocks, steps, operations, methods, etc. using orderings different than those described herein.

References herein to "one embodiment," "an embodiment," "an example embodiment," or similar phrases, indicate that the embodiment described can include a particular feature, structure, or characteristic, but every embodiment can not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein. Additionally, some embodiments can be described using the expression "coupled" and "connected" along with their derivatives. These terms are not necessarily intended as synonyms for each other. For example, some embodiments can be described using the terms "connected" and/or "coupled" to indicate that two or more elements are in direct physical or electrical contact with each other. The term "coupled," however, can also mean that two or more elements are not in direct contact with each other, but yet still co-operate or interact with each other.

The breadth and scope of this disclosure should not be limited by any of the above-described exemplary embodiments, but should be defined only in accordance with the following claims and their equivalents.

What is claimed is:

1. A computer-implemented method, comprising:
  determining a value identifier corresponding to a value to be searched for in a database based on a query;
  retrieving, from a lookup table, a prefix of an offset corresponding to a location in a posting list that identifies one or more row locations where the value is found in the database;
  retrieving, from a directory page, a suffix of the offset corresponding to the location;
  generating the offset based on the prefix and the suffix, wherein the prefix comprises two bits, and wherein the suffix comprises thirty-two bits, wherein a lookup table comprises a respective prefix of the offset and an indication of how many value identifiers include the respective prefix and a number of value identifiers that correspond to any smaller prefixes preceding the respective prefix in the lookup table;

retrieving, from the posting list, one or more row positions corresponding to the generated offset; and returning the one or more retrieved row positions responsive to the query.

2. The method of claim 1, wherein the lookup table comprises a plurality of prefixes in ascending order.

3. The method of claim 1, wherein the posting list is compressed using Golomb compression.

4. The method of claim 3, wherein the retrieving from the posting list comprises:

executing a skip pointer that jumps to a second portion of the compressed posting list without first decompressing a first portion of the compressed posting list, wherein the first portion is arranged prior to the second portion.

5. A system comprising:

a memory; and at least one processor coupled to the memory and configured to:

determine a value identifier corresponding to a value to be searched for in a database based on a query;

retrieve, from a lookup table, a prefix of an offset corresponding to a location in a posting list that identifies one or more row locations where the value is found in the database;

retrieve, from a directory page, a suffix of the offset corresponding to the location;

generate the offset based on the prefix and the suffix, wherein the prefix comprises two bits, and wherein the suffix comprises thirty-two bits, wherein a lookup table comprises a respective prefix of the offset and an indication of how many value identifiers include the respective prefix and a number of value identifiers that correspond to any smaller prefixes preceding the respective prefix in the lookup table;

retrieve, from the posting list, one or more row positions corresponding to the generated offset; and return the one or more retrieved row positions responsive to the query.

6. The system of claim 5, wherein the lookup table comprises a plurality of prefixes in ascending order.

7. The system of claim 5, wherein the posting list is compressed using Golomb compression.

8. The system of claim 7, wherein the processor that retrieves from the posting list is configured to:

execute a skip pointer that jumps to a second portion of the compressed posting list without first decompressing a first portion of the compressed posting list, wherein the first portion is arranged prior to the second portion.

9. A non-transitory computer-readable device having instructions stored thereon that, when executed by at least one computing device, cause the at least one computing device to perform operations comprising:

determining a value identifier corresponding to a value to be searched for in a database based on a query;

retrieving, from a lookup table, a prefix of an offset corresponding to a location in a posting list that identifies one or more row locations where the value is found in the database;

retrieving, from a directory page, a suffix of the offset corresponding to the location;

generating the offset based on the prefix and the suffix, wherein the prefix comprises two bits, and wherein the suffix comprises thirty-two bits, wherein a lookup table comprises a respective prefix of the offset and an indication of how many value identifiers include the respective prefix and a number of value identifiers that correspond to any smaller prefixes preceding the respective prefix in the lookup table;

retrieving, from the posting list, one or more row identifiers corresponding to the generated offset; and returning the one or more retrieved row identifiers responsive to the query.

10. The non-transitory computer-readable device of claim 9, wherein the lookup table comprises a plurality of prefixes in ascending order.

11. The non-transitory computer-readable device of claim 9, wherein the posting list is compressed using Golomb compression.

12. The method of claim 1, wherein the prefix and suffix combination account for all possible byte offset values.

* * * * *